US009128144B2

(12) United States Patent
Morrow et al.

(10) Patent No.: US 9,128,144 B2
(45) Date of Patent: Sep. 8, 2015

(54) SYSTEM AND METHOD OF QUANTIFYING COLOR AND INTENSITY OF LIGHT SOURCES

(75) Inventors: Daniel Creighton Morrow, Redding, CA (US); Jonathan Leigh Dummer, Redding, CA (US)

(73) Assignee: Sof-Tek Integrators, Inc., Redding, CA (US)

(*) Notice: Subject to any disclaimer, the term of this patent is extended or adjusted under 35 U.S.C. 154(b) by 587 days.

(21) Appl. No.: 13/205,170

(22) Filed: Aug. 8, 2011

(65) Prior Publication Data

US 2012/0038363 A1 Feb. 16, 2012

Related U.S. Application Data

(60) Provisional application No. 61/372,247, filed on Aug. 10, 2010.

(51) Int. Cl.
*G01R 31/00* (2006.01)
*G01R 31/26* (2014.01)
(Continued)

(52) U.S. Cl.
CPC .............. *G01R 31/2635* (2013.01); *G01J 3/28* (2013.01); *G01J 3/505* (2013.01); *G01R 31/44* (2013.01); *G01J 2001/4247* (2013.01)

(58) Field of Classification Search
CPC .. G01R 31/44; G01R 31/245; G01R 31/2635; G09G 3/006
USPC .................................................. 324/414, 403
See application file for complete search history.

(56) References Cited

U.S. PATENT DOCUMENTS 4,045,675 A * 8/1977 Kingsley et al. .......... 250/370.01
4,797,923 A * 1/1989 Clarke .......................... 704/203
(Continued)

FOREIGN PATENT DOCUMENTS

JP          55149875 A  * 11/1980  ........... G01R 19/165

OTHER PUBLICATIONS

Irena Fryc; Steven W. Brown; George P. Eppeldauer; Yoshi Ohno; LED-based spectrally tunable source for radiometric, photometric, and colorimetric applications; Opt. Eng. 44(11), 111309 (Aug. 26, 2004Jun. 13, 2005Nov. 3, 2005). doi:10.1117/1.2127952.*
(Continued)

*Primary Examiner* — Jermele M Hollington
*Assistant Examiner* — Christopher McAndrew
(74) *Attorney, Agent, or Firm* — Hamre, Schumann, Mueller & Larson, P.C.

(57) ABSTRACT

A system and method of quantifying color and intensity of light sources including LEDs, HBLEDs (High Brightness LEDs), and other Solid State Lights (SSLs) using C-parameters to model a Spectral Power Distribution (SPD) to improve precision, accuracy, repeatability and usefulness of measurement of optical properties of wavelength and radiant flux in manufacturing of an object, designing products and processes that use the object, and describing/defining the object, is provided. In one embodiment, a method of characterizing a Solid State Light (SSL) source includes a SSL source under test (DUT), a Spectral Power Distribution (SPD) of light emission of the SSL source, a curve-fitting function, a set of configuration data comprising the order of the curve-fitting function, the number of nodes, wavelength boundary limits, saturation threshold, and noise floor threshold, a computing device for curve-fitting, node detection, iteration and program control and inputting and outputting data; and a set of C-Parameters, noise parameters, and confidence values.

29 Claims, 6 Drawing Sheets (51) Int. Cl.
*G01R 31/44* (2006.01)
*G01J 3/28* (2006.01)
*G01J 3/50* (2006.01)
*G01J 1/42* (2006.01)

(56) References Cited

U.S. PATENT DOCUMENTS

| | | | | |
|---|---|---|---|---|
| 5,851,063 | A * | 12/1998 | Doughty et al. | 362/231 |
| 6,621,211 | B1 * | 9/2003 | Srivastava et al. | 313/503 |
| 6,675,106 | B1 | 1/2004 | Keenan et al. | |
| 7,567,871 | B2 * | 7/2009 | Rohde et al. | 702/28 |
| 7,777,495 | B2 * | 8/2010 | Mannerfelt | 324/414 |
| 7,876,103 | B2 * | 1/2011 | Mihai et al. | 324/414 |
| 8,519,714 | B2 * | 8/2013 | Harbers | 324/414 |
| 8,552,659 | B2 * | 10/2013 | Ashdown et al. | 315/291 |
| 2002/0097400 | A1 | 7/2002 | Jung et al. | |
| 2004/0218387 | A1 * | 11/2004 | Gerlach | 362/231 |
| 2009/0261834 | A1 * | 10/2009 | Kong | 324/414 |
| 2009/0267928 | A1 * | 10/2009 | Fryer et al. | 345/211 |
| 2010/0002440 | A1 | 1/2010 | Negley et al. | |
| 2010/0007752 | A1 | 1/2010 | Myhrvold et al. | |
| 2010/0301777 | A1 * | 12/2010 | Kraemer | 315/312 |
| 2011/0025337 | A1 * | 2/2011 | Morrow et al. | 324/414 |
| 2011/0068698 | A1 | 3/2011 | Swoboda et al. | |
| 2011/0273107 | A1 | 11/2011 | Hsia et al. | |

OTHER PUBLICATIONS

Steven W. Brown, Carlos Santana, and George P. Eppeldauer; Development of a Tunable LED-Based Colorimetric Source; vol. 107, No. 4, Jul.-Aug. 2002, [J. Res. Natl. Inst. Stand. Technol. 107, 363-371 (2002)].*

Subramanian Muthu, Frank J. P. Schuurmans, and Michael. D. Pashley; Red, Green, and Blue LEDs for White Light Illumination IEEE Journal on Selected Topics in Quantun Electronics, vol. 8, No. 2, Mar./Apr. 2002, pp. 333-338.*

International Search Report. International Patent Application No. PCT/US11/46993. Dec. 22, 2011. 3 pages.

Willner et al. "Optimal spectral and power parameters for all-optical wavelength shifting: single stage, fanout, and cascadability." Journal of Lightwave Technology [online] May 1995 [Retrieved on Dec. 12, 2011], vol. 13, Iss. 5 pp. 771-781, Retrieved from the Internet: <URL: http://ieeexplore.ieeeorg/xpl/freeabs_all.jsp?arnumber=387794>, Abstract only.

Ruisheng Zheng, "Luminous Efficiency and Color Rendering of Phosphor-Converted White LEDSs", The Illuminating Engineering Institute of Japan, J. Light & Vis. Env., vol. 32, No. 2, Jan. 1, 2008, pp. 230-233.

Lu et al., "Intelligent Spectral Design and Colorimetric Parameter Analysis for Light-emitting Diodes", Mechatronics and Machine Vision in Practice, International Conference, Dec. 1, 2007, pp. 118-122.

Extended European Search Report for EP11816891, dated Mar. 12, 2015, 7 pages.

Taiwanese Office Action and Search Report for TW 100128359, dated Mar. 4, 2015, 9 pages.

* cited by examiner

SYSTEM AND METHOD OF QUANTIFYING COLOR AND INTENSITY OF LIGHT SOURCES

CROSS-REFERENCE TO RELATED APPLICATION(S)

This patent application claims priority to the provisional patent application entitled "SYSTEM AND METHOD OF QUANTIFYING COLOR AND INTENSITY OF LIGHT", U.S. Patent Application No. 61/372,247, filed Aug. 10, 2010, which are incorporated herein by reference in its entirety.

FIELD OF THE INVENTION

The present invention relates generally to a system and method of quantifying color and intensity of light sources, and more particularly, to a system and method of quantifying color and intensity of light sources including LEDs (Light Emitting Diodes), HBLEDs (High Brightness LEDs), and the other SSL (Solid State Light) sources using C-parameters to model a Spectral Power Distribution (SPD) to improve precision, accuracy, repeatability and usefulness of measurement of optical properties of wavelength and radiant flux in manufacturing of an object, designing products and processes that use the object, and describing/defining the object.

BACKGROUND OF THE INVENTION

Systems and methods used to quantify the attributes or performance of an object play a crucial role in manufacturing the object, in designing products and processes that use the object, and in describing the object to consumers.

Over the years, various lighting industries have developed a number of systems or methods for quantifying the color and intensity of a light source. Such systems and methods rely on metrics (systems of measure based on a particular standard) and measurements (numerical values representing an amount, extent, or size determined by measuring) that are established by regulatory agencies, standards-producing bodies, industry stakeholders and individual organizations. The Metropolitan Gas Act of 1860, for instance, quantified the intensity of a burning candle to a known standard, introducing the standard definition of the metric "candlepower". In 1931, the International Commission on Illumination introduced the CIE 1931 XYZ Color Space and XYZ color coordinates. The CIE 1931 color space created a metric for describing the perceived color of an object based on a set of mathematical coordinates. The CIE 1931 color metric is based on three visual response functions (a function is a relation between two sets in which one element of the second set is assigned to each element of the first set, as in the expression y=2x) describing the relation between color and intensity for the three types of cone cells in the human eye. These are known as the color matching functions and result in a color representation comprised of three values (a value is a particular magnitude, number, or amount) known as tristimulus values. From the CIE tristimulus values metrics like color correlated temperature (CCT), color rendering index (CRI), CIE (x,y), lumen, dominant wavelength and MacAdam ellipse may be measured or derived. These metrics, which quantify the appearance of lighting systems to human observers under specified conditions, have been used by manufacturers, designers and customers to grade products, calculate the performance of the products in new applications, and compare products from competing sources, enable manufacturers, designers and customers to grade products, calculate the performance of the products in new applications, and compare products from competing sources.

The aforementioned and widely used luminous metrics are well suited for quantifying the color and intensity of an object under specific illumination and observing conditions by a human observer. A problem arises using these metrics for manufacturing SSLs and designing lighting systems based on SSLs because there are many applications and processes where the SSL is not directly observed by the human eye. The present invention overcomes this problem of misapplication of metrics.

Furthermore, implicit assumptions in these metrics about the illuminant, field of view, ambient light, pupil dilation, and the relevance and accuracy of the Color Matching Function (CMF) contribute errors when these metrics are used for many light sources, particularly LEDs, HBLEDs and the other SSL sources. The dominant wavelength and luminous intensity metrics assume a human observer in daylight is observing a light source through a restricted 2 or 10 degree field of view. These conditions are often not accurately reproduced during testing and are rarely appropriate to the manner in which light sources are actually viewed when assembled into a final product. These metrics suffer from a phenomenon known as metamerism which is the inability of a human observer to discern a certain mixture of different colored light sources from each other. All of these issues contribute uncertainty to the measurement of spectral properties of SSLs adversely affecting precision and repeatability of measurements. The present invention overcomes these limitations.

These problems have less impact for lights producing a continuous spectrum (a classical black body emitter) such as the tungsten filament found in a traditional light bulb. However, traditional light color and intensity metrics have proven inadequate to quantify the color and intensity of SSL sources for design, manufacturing and assembly processes. For example, SSL sources such as HBLEDs are used as the primary source of light emission. Unlike a tungsten filament, HBLEDs are not emitters of black body radiation. An LED radiates light by band-gap radiative recombination of electrons and holes in a compound semiconductor. The spectral characteristics of the emitted light from a SSL are significantly different from a black body radiation source. Characterizing the color and intensity of a SSL light source is fundamentally incorrect using the traditional metrics because the underlying physics are fundamentally different. The present invention overcomes the problem.

A typical manufacturing process for a SSL (hereinafter using LED as an example) begins with the manufacturing of a LED on a wafer substrate. These substrates are inspected for physical and optical defects, and the SPD of LED emissions are recorded at various points on the wafer and converted to metrics that are used to determine the uniformity and optical characteristics of the wafer or die. Data collected during this evaluation is commonly used in two ways. First, to control product quality, the data is compared against quality standards to determine how well the wafer and its die meet quality standards. The quality of the wafer (determined by the number and nature of the defects and the optical output) determines if the wafer is allowed to continue in the manufacturing process and determines the ultimate usability of the wafer. The second use of the data is for manufacturing process improvements. The data collected during this evaluation is correlated to specific process inputs. Once the correlation is determined, these process inputs can be controlled and manipulated to improve process yield and reduce non-uniformities. The uncertainty of traditional light metrics used for SSLs and the unsuitability for use of the same in subsequent manufacturing process steps increase the range of variation of manufacturing processes. The present invention reduces this range of variation thereby leading to improvements in manufacturing processes of SSLs and related lighting system design and manufacture.

SUMMARY OF THE INVENTION

The present invention relates generally to a system and method of quantifying color and intensity of light sources, and more particularly, to a system and method of quantifying color and intensity of light sources including LEDs, HBLEDs and other SSL sources using C-parameters to model a Spectral Power Distribution (SPD) to improve precision, accuracy, repeatability and usefulness of measurement of optical properties of wavelength and radiant flux in manufacturing of an object, designing products and processes that use the object, and describing/defining the object.

The present invention provides a C-Parameter system and method which comprises a system and method for describing color content and intensity of a light source, such as a LED, HBLED or other SSL source, with improved precision and efficiency compared to the commonly used luminous metrics which are well known to anyone skilled in the art. The C-Parameter system and method is an improved system and method of quantifying, specifying, communicating, evaluating, comparing and grading the color and intensity of a light source, the sum of or difference between light sources, and reflection and absorption of light by reflective or refractive surfaces and materials. The C-Parameter system and method is an improved system and method of controlling the manufacture of light sources, e.g. LEDs, HBLEDs, or other SSL light sources.

The expression of the optical SPD as a series (a group of similar things arranged in order) of functions, one example being a Gaussian function, significantly improves the ability to quantify and characterize optical output power of light sources, including SSL sources. The desired SPD can be expressed concisely as a set of C-Parameters, and the quality of a SSL being tested can then be described in terms of a set of deviations or correlations of individual or subsets of C-Parameters, or as a deviation from or correlation with a desired SPD. A C-Parameter is a real number that is a coefficient of a function used to characterize the SPD of a SSL. A C-Parameter Tuple is a set of C-Parameters that together satisfy the solution of a function used to characterize the SPD of a SSL. The term C-Parameters denotes the set of C-Parameter Tuples that, when combined, characterize the SPD of a SSL.

BRIEF DESCRIPTION OF THE DRAWINGS OF THE INVENTION

DETAILED DESCRIPTION OF THE PREFERRED EMBODIMENT OF THE INVENTION

Figure 1:
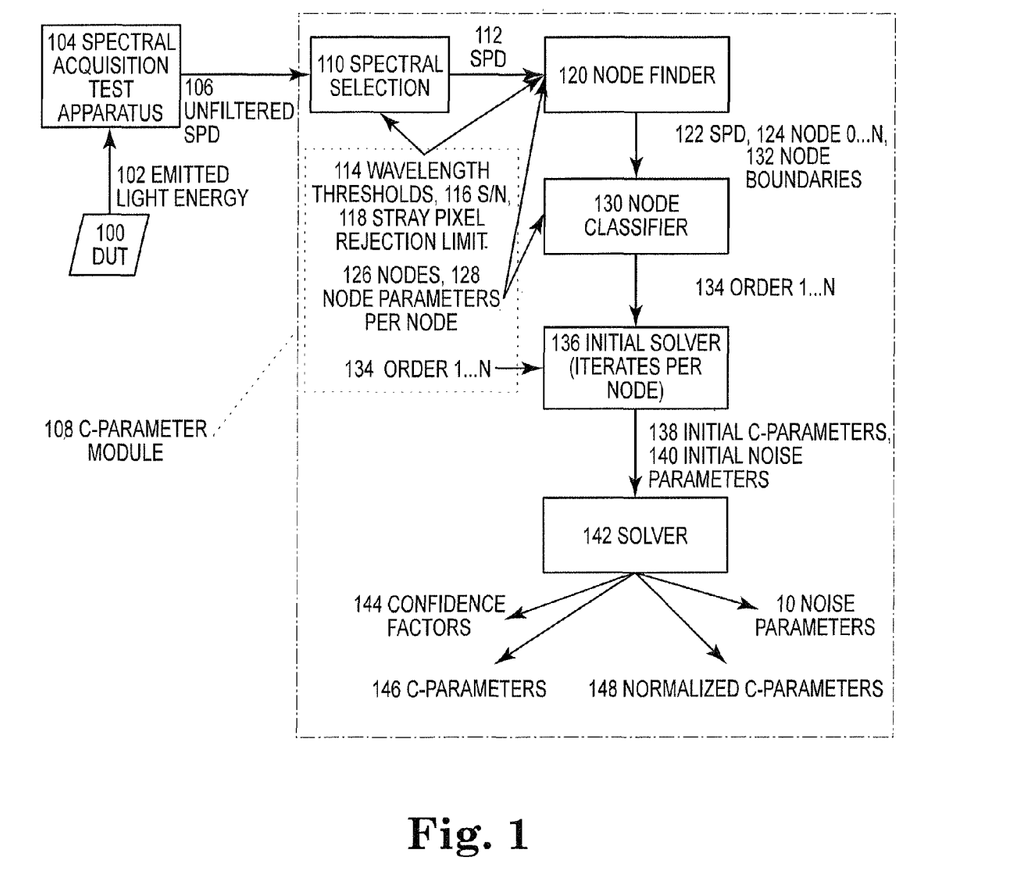
FIG. 1 is a diagram illustrating one embodiment of a C-Parameter system and method of quantifying color and intensity of a SSL source, in accordance with the principles of the present invention.

FIG. 1 illustrates one embodiment of the present invention in which a SSL source, such as a HBLED device under test 100 (hereinafter referring to "DUT 100"), emits light energy 102 into a spectral acquisition test apparatus 104 which captures the emitted light energy as a spectrum which describes power or energy as a function of wavelength. For the purposes of HBLED test and measurement this spectrum is an unfiltered spectral power distribution (SPD) 106. The unfiltered SPD 106 is input to the C-Parameter module 108. The C-Parameter module 108 characterizes the energy or power emitted by the DUT 100 as a function of wavelength in terms of a linear superposition of functions. The specific form of the function used in the series is determined by the physics of the DUT 100. In the instance of the HBLED application, the physical mechanisms (hole/electron radiative recombination in a band-gap compound semiconductor) that cause optical emissions are describable by a function known as a Gaussian function. In this instantiation of the present invention, the C-Parameter module 108 is arranged and configured to solve for Gaussian function coefficients. Each arrangement and configuration provides coefficients to a Gaussian function. As such, for this instantiation of the present invention, the C-Parameter module 108 outputs C-Parameters 146 comprising a plurality of sets of 3 coefficients, each set determining one Gaussian curve referred to as a node 124. The C-Parameters associated with a given SPD 112 are the coefficients of the series of Gaussian curves referring to as a set of nodes 124 such that, when summed, the resulting curve has an effective correlation to the shape and magnitude of the measured SPD 112.

Further in FIG. 1, a Spectral Selection process 110 takes as input Wavelength Thresholds (high and low) 114, Signal to Noise (S/N) Threshold 116, and Stray Pixel Rejection Limit 118 to select spectral data of interest from the unfiltered SPD 106 and outputs the threshold inputs 114, 116, 118 and the selected SPD 112 to a Node Finder process 120.

The Node Finder process 120 then takes as input number of nodes 126 to find the SPD 122 and outputs the SPD 122 as well as each "found" node 124, with node boundaries 132 to a Node Classifier process 130.

The Node Classifier process 130 then determines the optimized order 1 . . . N 134 for each node 124. The node boundaries 132 and order 1 . . . N 134 are used as constraints by the Initial Solver process 136.

The Initial Solver process 136 iterates over each node 124 and each order 1 . . . N 134 using the node boundaries 132 to determine an initial solution set of initial C-Parameters 138 and initial Noise Parameters 140 for each node 124 and order 1 . . . N 134.

The initial C-Parameters 138 and initial Noise Parameters 140 are inputs to a Solver process 142 which finds coefficients of the best fit solution of the Gaussian function for each order 1 ... N 134 bounded node (124, 132) and outputs them as a set of N-order C-Parameters 146 together with a Confidence Factor 144 and Noise Parameters 150.

Further in FIG. 1, a set of Normalized C-Parameters 148 may be optionally produced. The Normalized C-Parameters 148 are C-Parameters where the magnitude of the sum of the individual curves has been normalized to remove the influence of the intensity, while preserving the relative color content or wavelength.

It is appreciated that C-Parameters are a set of real numbers which precisely describe the optical output power of a light source as a function of wavelength (e.g. color content). The C-Parameter system and method models the optical output power of a light source as a set of functions, for example, a series of Gaussian functions. In one embodiment of the present invention wherein a Gaussian function is used to model the optical output power of a SSL, there are 3 Gaussian function coefficients (hereinafter referred to as a C-Parameter tuple) that describe gain, center wavelength and standard deviation respectively. In one embodiment of the present invention, when configured for a $2^{nd}$ order fit, two C-Parameter tuples will be generated, one for each order. Stated generally, an 'n' order fit produces 'n' C-Parameter tuples. In one embodiment of the present invention, having 3 Gaussian function coefficients and a $2^{nd}$ order fit, the method outputs 6 C-Parameters. In one embodiment of the present invention, for a SSL having two active light-emitting elements, such as a blue phosphor-pumped HBLED, the SSL SPD is modeled as a bimodal distribution having two nodes. A node is an exclusive subset of the SPD comprising all points within a minimum wavelength to a maximum wavelength. Functionally, each node corresponds to a light generating mechanism within the DUT, for example: {Blue LED, Phosphor}, {Red LED, Green LED, Blue LED}, {Red LED, Green LED, Blue LED, Yellow LED}. In one embodiment of the present invention, having two discrete emission sources and thus two nodes, the method outputs 12 real numbers, organized into 2 sets (one per active element or SPD node) of 2 C-Parameter tuples (one per order of the curve-fitting solution), each C-Parameter tuple comprising 3 Gaussian function coefficients for a total of 12 real numbered C-Parameters.

Figure 2:
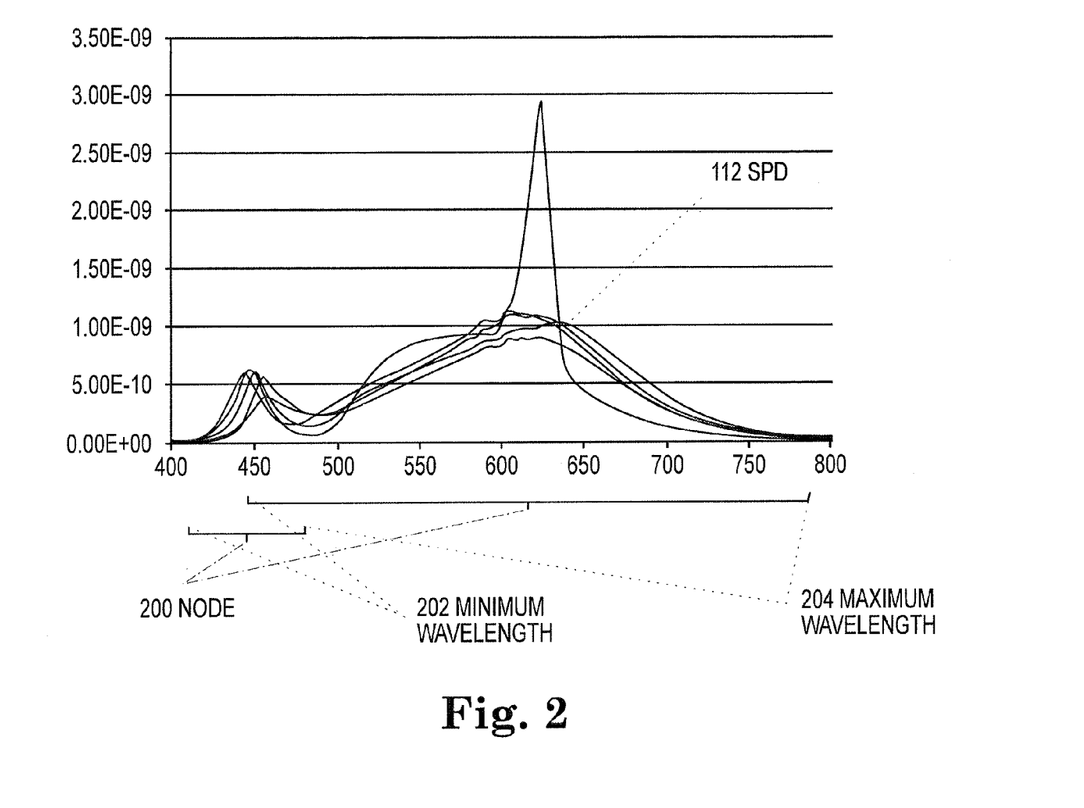
FIG. 2 is a diagram illustrating one embodiment of a method of finding nodes in a SPD, in accordance with the principles of the present invention.

FIG. 2 is a graph of SPD outputs of various SSL sources, each one comprising a blue HBLED device and a phosphor coating, showing the bimodal SPD that is produced. In one embodiment of the present invention, each SPD is modeled as having two Nodes 200, each Node 200 bounded by a Minimum Wavelength 202 and a Maximum Wavelength 204 and fit with a $2^{nd}$ order Gaussian function.

Figure 3:
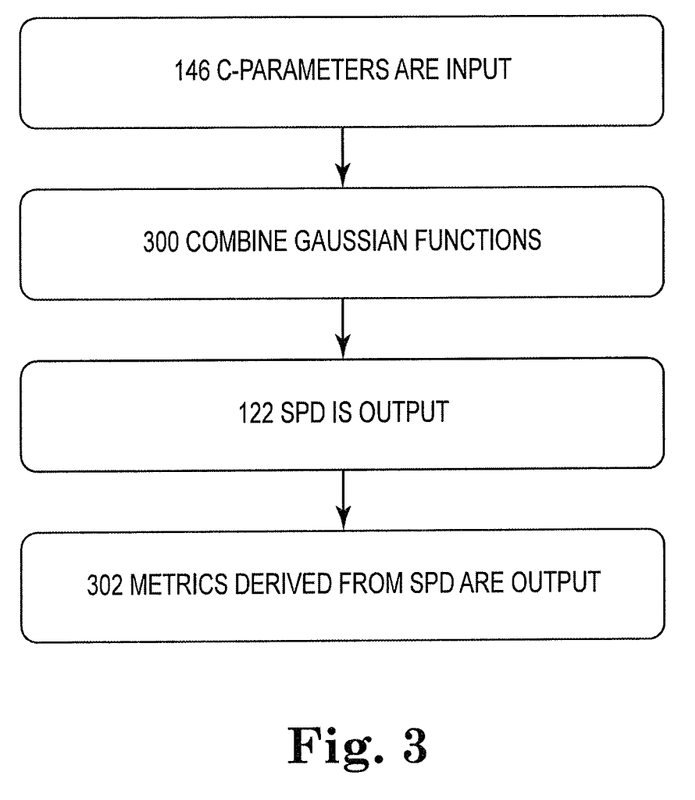
FIG. 3 is a diagram illustrating one embodiment of a process of inputting the C-Parameters and outputting an SPD and various metrics using the C-Parameter system and method of quantifying color and intensity of a SSL source, in accordance with the principles of the present invention.

FIG. 3 illustrates one embodiment of the present invention in which C-Parameters 146 for a device are used to output the SPD 122 as well as other metrics 302 that can be derived from the SPD 122 for that device. As shown, the problem of irreversibility of existing metrics is overcome by reconstructing the SPD then deriving light output metrics from the reconstructed SPD. FIG. 3 also illustrates the method of compressing an SPD by encoding it as a set of C-Parameters which can be used to uncompress the encoded information back into the original SPD with minimal loss of information. The amount of loss inversely correlates to the order of the fitting function.

Figure 4:
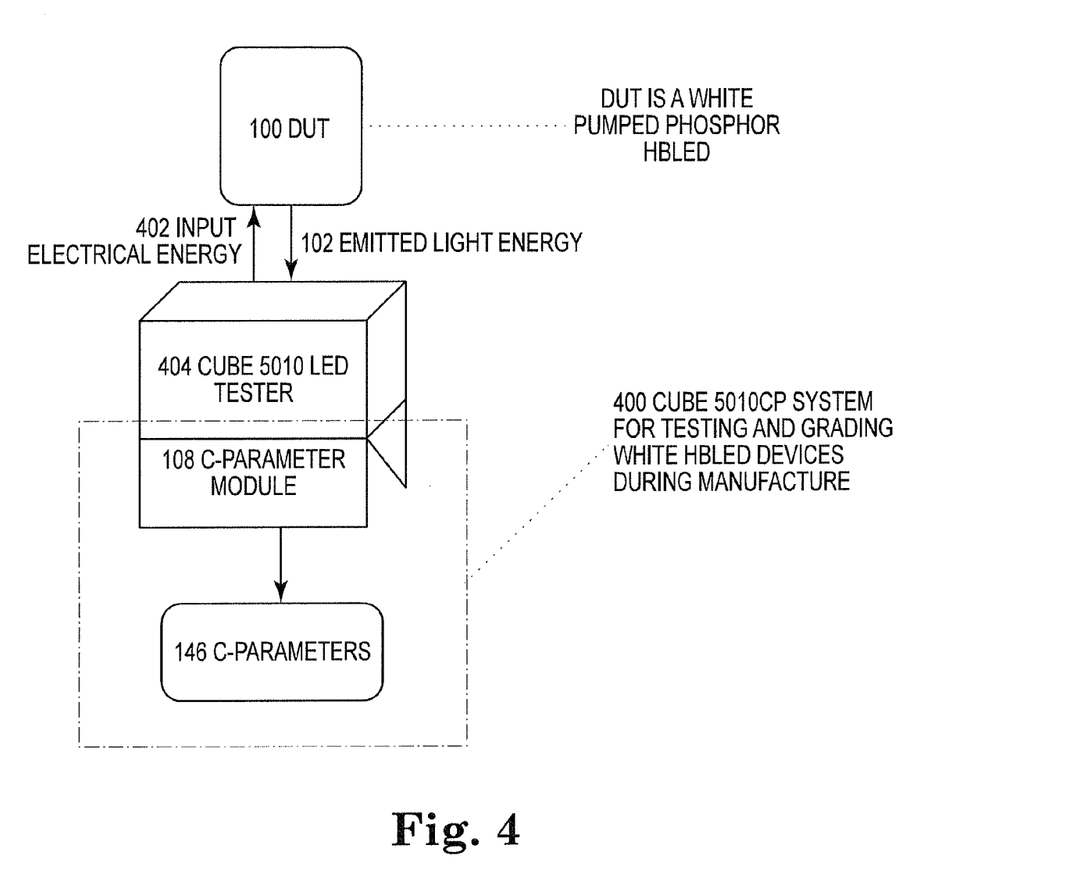
FIG. 4 is a diagram illustrating one embodiment of a SSL manufacturing tester apparatus for illumination devices. The apparatus implements the C-Parameter system and method of quantifying color and intensity of a SSL source, in accordance with the principles of the present invention.

FIG. 4 illustrates one embodiment of the present invention in which a CUBE 5010CP system 400 implements the C-Parameter method to test a white HBLED SSL. In this embodiment, the DUT 100 is a white HBLED SSL comprising 2 sources of light emission, a blue LED and a yellow phosphor coating. A tester, for instance, a CUBE 5010 LED tester 404, inputs electrical energy 402 to the DUT 100. The DUT 100 emits light energy 102 which is acquired by the tester 404 and passed to the CUBE 5010CP system 400. The CUBE 5010CP system 400 comprises a C-Parameter Module 108 that integrates with the tester 404 to input light energy 102 and implements the C-Parameter method to output C-Parameters 146.

Figure 5:
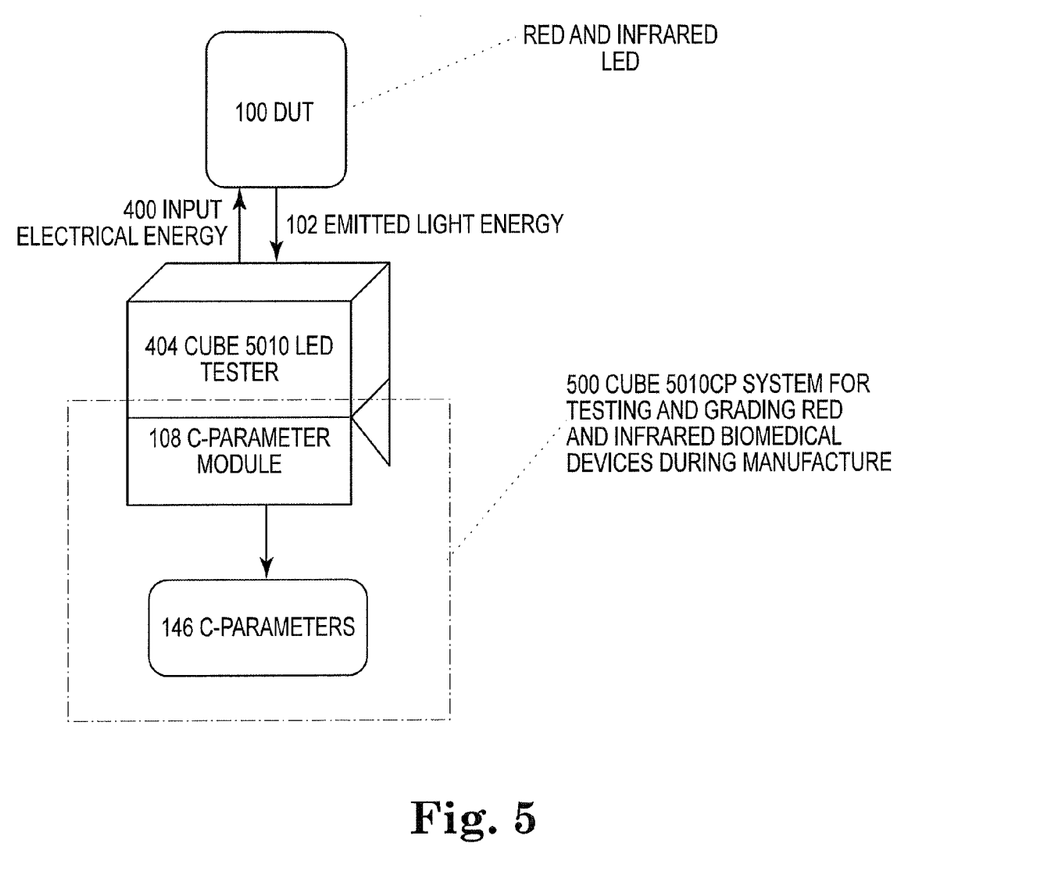
FIG. 5 is a diagram illustrating one embodiment of a SSL manufacturing tester apparatus for biomedical devices that implements the C-Parameter system and method of quantifying color and intensity of a SSL source, in accordance with the principles of the present invention.

FIG. 5 illustrates one embodiment of the present invention in which a CUBE 5010CP system 500 implements the C-Parameter method to test a red/infrared SSL manufactured for biomedical applications. In this embodiment, the DUT 100 is a red and infrared LED SSL comprising 2 sources of light emission, a red LED and an infrared LED. A tester, one possible instantiation being a CUBE 5010 LED tester 404, inputs electrical energy 402 to the DUT 100. The DUT 100 emits light energy 102 which is acquired by the tester 404 and passed to the CUBE 5010CP system 500. The CUBE 5010CP system 500 comprises a C-Parameter Module 108 that integrates with the tester 404 to input light energy 102 and implements the C-Parameter method to output C-Parameters 146.

Figure 6:
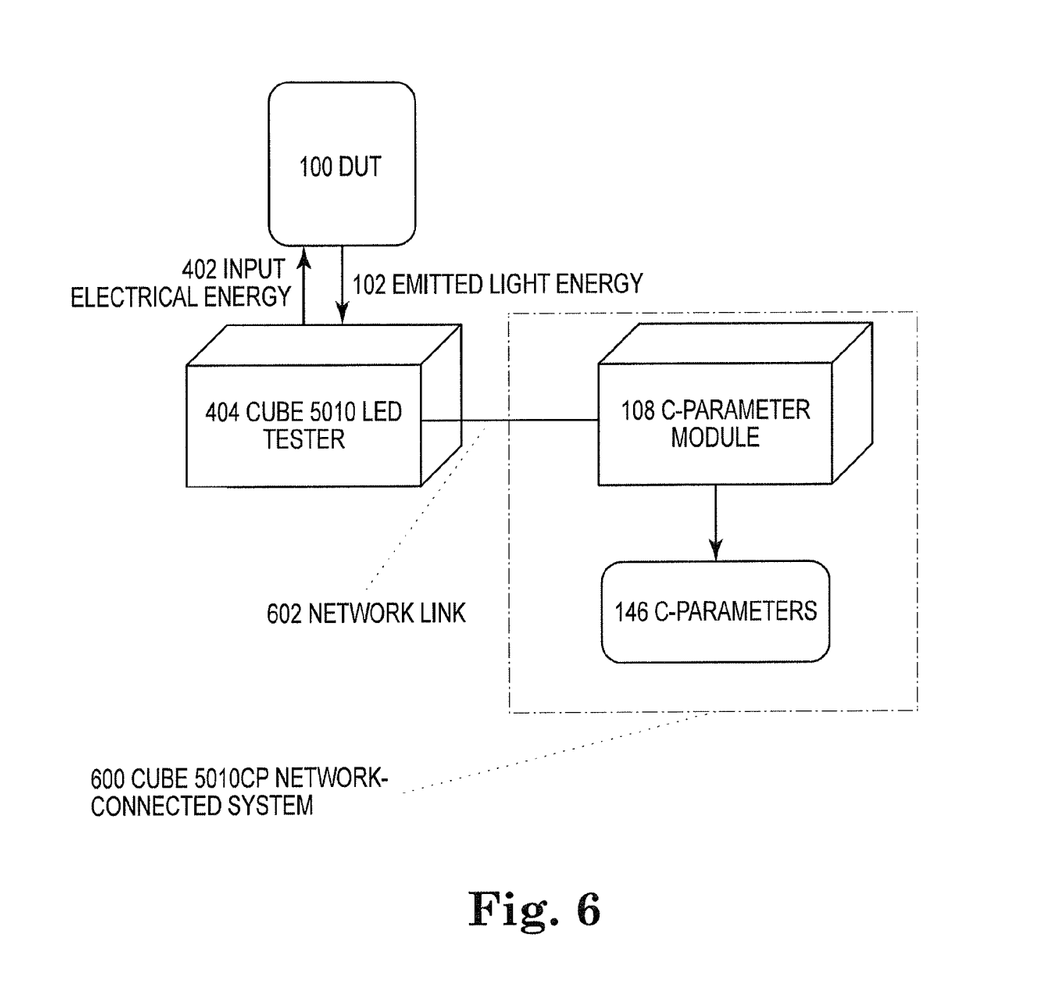
FIG. 6 is a diagram illustrating one embodiment of a manufacturing SSL tester apparatus in a networked C-Parameter module configuration that implements the C-Parameter system and method of quantifying color and intensity of a SSL source, in accordance with the principles of the present invention.

FIG. 6 illustrates one embodiment of the present invention in which a CUBE 5010CP network-connected system 600 implements the C-Parameter method to test a SSL in a network-connected configuration. In this embodiment, the DUT 100 is a SSL. A tester, for instance, a CUBE 5010 LED tester 404, inputs electrical energy 402 to the DUT 100. The DUT 100 emits light energy 102 which is acquired by the tester 404 and passed over a network link 602 to the CUBE 5010CP network-connected system 600. The CUBE 5010CP network-connected system 600 comprises a C-Parameter Module 108 that integrates over a network connection with the tester 404 to input the light energy data 102 and implements the C-Parameter method to output C-Parameters 146.

The characteristics, features and advantages of the present invention for providing a C-Parameter system and method of quantifying color and intensity of SSL sources include, but not limited to, the following:

1. The C-Parameter system and method represents the nodes present in an SPD as a set of curve-fitting function coefficients.
2. One instantiation of the present invention yields C-Parameters that represent one or more nodes present in an SPD as a set of Gaussian function coefficients.
3. The C-Parameter system and method reconstructs an SPD from the C-Parameters.
4. The C-Parameter system and method compresses an SPD without loss of information.
5. The C-Parameter system and method characterizes an SPD of SSL light sources, including but not limited to, LEDs.
6. The C-Parameter system and method normalizes the color content of an SPD.
7. The C-Parameter system and method detects non-signal data present in spectral measurements of LEDs such as, but not limited to, configuration errors, measurement noise, manufacturing defects.
8. The C-Parameter system and method filters noise that is present in a measurement of an SPD of SSLs in such a way that it improves noise filtering over traditional systems and methods known to one skilled in the art such as box-car filtering or Gaussian filtering.
9. The C-Parameter system and method removes dark noise and shot noise present in spectrometric measurements of an SPD of LEDs and increases the signal to noise ration of LEDs during testing.
10. The C-Parameter system and method produces metrics useful to SSL manufacturing processes.

11. One instantiation of the present invention produces process control data that improves the manufacturing process for semiconductor LEDs used for SSL applications.
12. One instantiation of the present invention produces process control data that improves the manufacturing process for semiconductor LEDs used for biomedical applications.
13. The C-Parameter system and method improves binning, sorting and grading of SSL devices during manufacture.
14. The C-Parameter system and method may be used to bin and match LEDs for color mixing applications such as phosphor/blue to optimize the combined output of an SSL.
15. The C-Parameter system and method is an improved measure of the intensity of an LED than luminous flux.
16. The C-Parameter system and method is an improved measure of the color of an LED than color coordinates in a color space.
17. One instantiation of the present invention improves optical system design software over traditional techniques such as N-band (RGB) representation.
18. C-Parameters provide color content information required to accurately calculate optical interactions between an emitter and mechanical, chemical and optical components of an LED or other SSL device.
19. The C-Parameter system and method eliminates problems that arise when using photometric descriptions for indirect lighting applications involving reflected and absorbed light emissions.
20. The C-Parameter system and method accurately represents the SPD of LEDs for applications other than direct observation by human eyes. Examples of applications include photoactive organic materials and human physiological responses to light such as circadian rhythms and the stimulation by blue light of serotonin and melatonin production.
21. The C-Parameter system and method is an improved system and method of combining the SPDs of multiple LEDs into a single SPD.
22. The C-Parameter system and method isolates the SPD of each emitter in a combined or composite power distribution such as the emission of a white HBLED or an RGB white LED.
23. The C-Parameter system and method separately quantifies color and intensity of LEDs as discrete elements.
24. The C-Parameter system and method improves over the "choose the saddle" system and method to estimate junction temperature of an LED.
25. The C-Parameter system and method identifies a separate junction temperature curve for each LED in a composite emissive device or SSL.

The invention claimed is:
1. A method of characterizing a Solid State Light (SSL) source, comprising:
obtaining an SSL source;
energizing the SSL source to emit light;
acquiring a Spectral Power Distribution (SPD) of light emitted by the SSL source with an SPD acquisition apparatus;
selecting at least a portion of the SPD;
outputting the selected SPD to a computing device;
detecting a node in the SPD, wherein the node is a continuous spectrum of light having a predetermined minimum and maximum wavelength defining a boundary limit within the SPD, the node corresponds to a specific light generating mechanism, and the node is detected based on a saturation threshold within the boundary limit;
determining an order for a curve fitting function for the node; wherein the curve fitting function is determined based on the specific light generating mechanism of the node;
solving function coefficients of the curve fitting function for fitting the node, wherein the function coefficients are expressed as a set of C-Parameters;
obtaining a set of noise parameters and a set of confidence values for the curve fitting function; and
outputting the set of C-Parameters, the set of noise parameters, and the set of confidence values.

2. The method of claim 1, further comprising:
normalizing the set of C-Parameters to remove influence of intensity, while preserving relative color content and/or wavelength; and
generating a set of normalized C-Parameters.

3. The method of claim 2, further comprising:
compressing SPD information content.

4. The method of claim 3, further comprising:
filtering noise in the SPD.

5. The method of claim 4, further comprising:
collecting the set of C-Parameters;
combining functions using C-Parameters as the function coefficients;
reconstructing the SPD from the combination of functions; and
generating a reconstructed SPD.

6. The method of claim 5, further comprising:
generating a set of metrics derived from the reconstructed SPD.

7. The method of claim 6, further comprising:
uncompressing the SPD.

8. The method of claim 1, further comprising:
generating the set of C-Parameters for the SSL source in a manufacturing process for the SSL source; and
providing process control feedback data based on the C-Parameters for evaluation and improvement of the manufacturing process for the SSL source.

9. The method of claim 1, wherein the specific light generating mechanism is one selected from the following, phosphor light generating mechanism, recombination of electrons and holes having an energy bandgap for generating blue light, recombination of electrons and holes having an energy bandgap for generating green light, recombination of electrons and holes having an energy bandgap for generating yellow light, and recombination of electrons and holes having an energy bandgap for generating red light.

10. The method of claim 1, wherein the SSL source is an LED.

11. The method of claim 1, wherein the SSL source is an HBLED.

12. The method of claim 1, wherein the SSL source is comprised of more than one source of light emission.

13. The method of claim 1, wherein the computing device includes a C-Parameter module arranged and configured to solve for the function coefficients,
wherein the C-Parameter module outputs the set of C-Parameters comprising a plurality of sets of C-Parameter tuples, each C-Parameter tuple comprising a set of coefficients of the curve fitting function for the node.

14. The method of claim 1, wherein the curve fitting function is a Gaussian function, and the computing device includes a C-Parameter module arranged and configured to solve for Gaussian function coefficients, wherein the C-Parameter module outputs the set of C-Parameters comprising a plurality of sets of C-Parameter tuples, each C-Parameter tuple comprising 3 coefficients determining the Gaussian function for the at least one node.

15. A system of characterizing a Solid State Light (SSL) source, comprising:
an energy source stimulating the SSL source to emit light;
an acquisition apparatus for acquiring a Spectral Power Distribution (SPD) of light emitted by the SSL source;
a computing device, wherein the computing device is configured to obtain a set of predetermined configuration data comprising:
a curve fitting function, an order of the curve fitting function, a wavelength boundary limit within the SPD, a saturation threshold,
wherein the curve fitting function, the boundary limit, and the saturation threshold are determined based on a node, wherein the node corresponds to a specific light generating mechanism of the SSL source;
the computing device is configured to detect the node in the SPD based on the wavelength boundary limit and the saturation threshold; wherein the computing device is configured to solve the curve fitting function for the node to obtain and output a set of C-Parameters, noise parameters, and confidence values for the node.

16. The system of claim 15, further comprising:
means for normalizing the C-Parameters to remove influence of intensity, while preserving the relative color content and/or wavelength.

17. The system of claim 16, further comprising:
means for compressing SPD information content.

18. The system of claim 17, further comprising:
means for filtering noise from the SPD.

19. The system of claim 18, further comprising:
means for collecting the set of C-Parameters; and
means of generating a reconstructed SPD.

20. The system of claim 19, further comprising:
means for generating a set of metrics from the reconstructed SPD.

21. The system of claim 20, further comprising:
means for uncompressing the SPD.

22. The system of claim 15, further comprising:
means for manufacturing the SSL source;
means for collecting the set of C-Parameters for the SSL source; and
means for providing process control feedback data for evaluation and improvement of the step of manufacturing the SSL source.

23. The system of claim 15, wherein the specific light generating mechanism is one selected from the following, phosphor light generating mechanism, recombination of electrons and holes having an energy bandgap for generating blue light, recombination of electrons and holes having an energy bandgap for generating green light, recombination of electrons and holes having an energy bandgap for generating yellow light, and recombination of electrons and holes having an energy bandgap for generating red light.

24. The system of claim 15, wherein the SSL source is an LED.

25. The system of claim 15, wherein the SSL source is an HBLED.

26. The system of claim 15, wherein the SSL source is comprised of more than one source of light emission.

27. The system of claim 15, wherein the computing device includes a C-Parameter module arranged and configured to solve for Gaussian function coefficients, wherein the C-Parameter module outputs a set of C-Parameters comprising a plurality of sets of C-Parameter tuples, each C-Parameter tuple comprising 3 coefficients determining one Gaussian curve representing one of the one or more nodes such that, when summed, a resulting curve correlates to a shape and magnitude of the SPD.

28. The method of claim 1, wherein,
the order for the curve fitting function for the node is second order, wherein two Gaussian functions are used for curve fitting the node and each Gaussian function has three function coefficients.

29. The method of claim 15, wherein,
the order for the curve fitting function for the node is second order, wherein two Gaussian functions are used for curve fitting the node and each Gaussian function has three function coefficients.

* * * * *